United States Patent
Mizuochi et al.

(10) Patent No.: US 12,030,974 B2
(45) Date of Patent: Jul. 9, 2024

(54) COMPOSITION FOR FORMING BLOCK COPOLYMER LAYER FOR FORMATION OF MICROPHASE-SEPARATED PATTERN

(71) Applicant: NISSAN CHEMICAL CORPORATION, Tokyo (JP)

(72) Inventors: Ryuta Mizuochi, Toyama (JP); Yasunobu Someya, Toyama (JP); Hiroyuki Wakayama, Toyama (JP); Masami Kozawa, Funabashi (JP); Shinsuke Tadokoro, Funabashi (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 523 days.

(21) Appl. No.: 17/258,227

(22) PCT Filed: Jul. 16, 2019

(86) PCT No.: PCT/JP2019/027889
§ 371 (c)(1),
(2) Date: Jan. 6, 2021

(87) PCT Pub. No.: WO2020/017494
PCT Pub. Date: Jan. 23, 2020

(65) Prior Publication Data
US 2021/0284782 A1    Sep. 16, 2021

(30) Foreign Application Priority Data
Jul. 17, 2018 (JP) .................................. 2018-134225

(51) Int. Cl.
*C08F 299/02* (2006.01)
*B29C 71/02* (2006.01)
(Continued)

(52) U.S. Cl.
CPC .......... *C08F 299/02* (2013.01); *C08F 212/08* (2013.01); *C08F 212/22* (2020.02);
(Continued)

(58) Field of Classification Search
CPC ........................... C08F 212/22; C08F 230/08
See application file for complete search history.

(56) References Cited

U.S. PATENT DOCUMENTS

| | | |
|---|---|---|
| 2013/0045601 A1 | 2/2013 | Ogihara et al. |
| 2013/0344242 A1 | 12/2013 | Willson et al. |

(Continued)

FOREIGN PATENT DOCUMENTS

| | | |
|---|---|---|
| JP | 2013-041140 A | 2/2013 |
| JP | 2015-005750 A | 1/2015 |

(Continued)

OTHER PUBLICATIONS

Sunday et al., Macromolecules 2018, 51, 173-180.*
(Continued)

*Primary Examiner* — Vu A Nguyen
(74) *Attorney, Agent, or Firm* — Oliff PLC

(57) ABSTRACT

A self-assembled film forming composition for forming a phase-separated structure of a block copolymer layer on a substrate, containing a block copolymer and a solvent, and is configured such that: the block copolymer is obtained by bonding a silicon-free polymer to a silicon-containing polymer that contains, as a constituent unit, styrene that is substituted by a silicon-containing group; the silicon-free polymer contains a structure derived from formula [1-1] or formula [1-2]; and the silicon-containing group contains one silicon atom. [In formula [1-1] or formula [1-2], each of $R^1$ and $R^2$ independently represents a hydrogen atom, a halogen atom or an alkyl group having 1-10 carbon atoms; and each of $R^3$-$R^5$ independently represents a hydrogen atom, a
(Continued)

hydroxy group, a halogen atom, an alkyl group having 1-10 carbon atoms, an alkoxy group having 1-10 carbon atoms, a cyano group, an amino group, an amide group or a carbonyl group.]

6 Claims, 1 Drawing Sheet

(51) Int. Cl.
| | |
|---|---|
| *C08F 212/08* | (2006.01) |
| *C08F 212/14* | (2006.01) |
| *C08F 220/18* | (2006.01) |
| *C08F 222/40* | (2006.01) |
| *C08F 230/08* | (2006.01) |
| *C08J 5/18* | (2006.01) |
| *H01L 21/3065* | (2006.01) |

(52) U.S. Cl.
CPC .......... *C08F 220/18* (2013.01); *C08F 222/40* (2013.01); *C08F 230/08* (2013.01); *C08J 5/18* (2013.01); *C08J 7/08* (2013.01); *H01L 21/3065* (2013.01)

(56) References Cited

U.S. PATENT DOCUMENTS

2017/0240681 A1* 8/2017 Willson ............... C09D 153/00
2019/0233559 A1 8/2019 Mizuochi et al.

FOREIGN PATENT DOCUMENTS

| WO | 2017/147185 A1 | 8/2017 |
| WO | 2018/051907 A1 | 3/2018 |

OTHER PUBLICATIONS

Durand et al., J, Polym. Sci., Part A: Polymer Chemistry 2015, 53, 344-352.*
Lane et al., ACS Nano 2017, 11, 7656-7665.*
Lane et al.; "Directed Self-Assembly and Pattern Transfer of Five Nanometer Block Copolymer Lamellae;" ACS Nano; 2017; pp. 7656-7665; vol. 11.
Sep. 24, 2019 Search Report issued in International Patent Application No. PCT/JP2019/027889.
Jul. 25, 2023 Office Action issued in Japanese Patent Application No. 2020-531311.

* cited by examiner

COMPOSITION FOR FORMING BLOCK COPOLYMER LAYER FOR FORMATION OF MICROPHASE-SEPARATED PATTERN

TECHNICAL FIELD

The present invention relates to a composition for forming a self-assembly film (or a block copolymer layer) for the formation of a microphase-separated pattern, preferably to a composition for forming a self-assembly film for the formation of a microphase-separated pattern in a semiconductor device manufacturing process.

BACKGROUND ART

The recent advancements in miniaturization of large scale integration (LSI) have led to a demand for techniques capable of fabricating finer structures. To meet such demands, attempts have been made in which finer patterns are formed by utilizing a phase-separated structure that is organized by the self-assembly of a block copolymer containing polymers which are incompatible with one another. According to a method proposed so far, for example, an underlayer film-forming composition is applied onto a substrate to form an underlayer film of the composition, then a self-assembly film containing a block copolymer of two or more different polymers is formed on the surface of the underlayer film, the block copolymer in the self-assembly film is then separated into phases, and a phase of at least one of the polymers constituting the block copolymer is selectively removed to form a pattern.

Non Patent Literature 1 discloses induced self-assembly and a pattern transfer method using poly(5-vinyl-1,3-benzodioxole)-b-poly(pentamethyldisilylstyrene) block polymer.

However, there is still a strong demand for techniques capable of giving rise to a finer microphase-separated structure from a block copolymer layer perpendicularly to a substrate.

CITATION LIST

Non Patent Literature

Non Patent Literature 1: ACS NANO 2017, 11, 7656-7665

SUMMARY OF INVENTION

Technical Problem

An object of the present invention is to provide a composition for forming a self-assembly film including a block copolymer that is capable of forming a finer microphase-separated structure perpendicularly to a substrate. Other objects of the present invention are, by using the composition, to provide a method for producing a phase-separated pattern from a block copolymer, to provide a process for manufacturing a semiconductor device, and to provide a laminate.

Solution to Problem

The present invention embraces the following.
[1] A self-assembly film-forming composition comprising a block copolymer and a solvent, wherein the composition is for forming a phase-separated structure by a block copolymer layer on a substrate,
the block copolymer comprises a silicon-free polymer and a silicon-containing polymer bonded together, the silicon-containing polymer comprising a structural unit comprising styrene substituted with a silicon-containing group, and
the silicon-free polymer comprises a unit structure represented by formula (1-1) or formula (1-2) below, and the silicon-containing group contains one silicon atom,

[Chemical Formula 1]

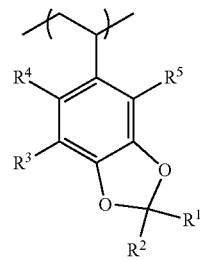

Formula (1-1)

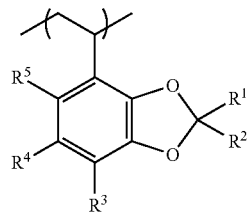

Formula (1-2)

(in formula (1-1) and formula (1-2), $R^1$ and $R^2$ are each independently a hydrogen atom, a halogen atom or a C1-C10 alkyl group; and $R^3$ to $R^5$ are each independently a hydrogen atom, a hydroxy group, a halogen atom, a C1-C10 alkyl group, a C1-C10 alkoxy group, a cyano group, an amino group, an amide group or a carbonyl group).

[2] A self-assembly film-forming composition comprising a block copolymer and a solvent, wherein the composition is for forming a phase-separated structure by a block copolymer layer on a substrate,
the block copolymer comprises a silicon-free polymer and a silicon-containing polymer bonded together, the silicon-containing polymer comprising a structural unit comprising styrene substituted with a silicon-containing group,
the silicon-free polymer comprises a unit structure represented by formula (1-1) or formula (1-2) below:

[Chemical Formula 2]

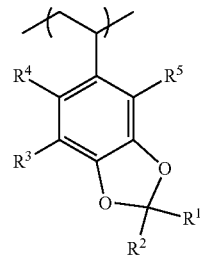

Formula (1-1)

-continued

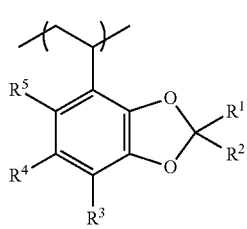

Formula (1-2)

(in formula (1-1) and formula (1-2), $R^1$ and $R^2$ are each independently a hydrogen atom, a halogen atom or a C1-C10 alkyl group; and $R^3$ to $R^5$ are each independently a hydrogen atom, a hydroxy group, a halogen atom, a C1-C10 alkyl group, a C1-C10 alkoxy group, a cyano group, an amino group, an amide group or a carbonyl group), and the block copolymer layer is to be applied onto an underlayer film comprising a copolymer comprising the following unit structures:

unit structure (A) derived from a styrene compound containing a tert-butyl group, unit structure (B) derived from an aromatic-containing vinyl compound containing no hydroxy group with the proviso that it is different from unit structure (A), and unit structure (C) derived from a compound containing a (meth)acryloyl group and no hydroxy groups.

[3] The self-assembly film-forming composition according to [1] or [2], wherein the silicon-containing polymer comprises a unit structure represented by the following formula (2):

[Chemical Formula 3]

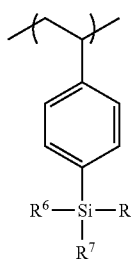

Formula (2)

(in formula (2), $R^6$ to $R^8$ are each independently a C1-C10 alkyl group or a C6-C40 aryl group).

[4] The self-assembly film-forming composition according to any one of [1] to [3], wherein the block copolymer layer is to be overcoated with:

an upper layer film comprising a copolymer (A) comprising unit structures (a) derived from a maleimide structure and from a styrene structure.

[5] A method for producing a phase-separated pattern by a block copolymer, comprising the steps of:

(1) forming a block copolymer layer on a substrate using the self-assembly film-forming composition according to any one of [1] to [4], and (2) separating the block copolymer layer formed on the substrate into phases.

[6] The method for producing a phase-separated pattern by a block copolymer, further comprising a step of forming an underlayer film on the substrate prior to step (1).

[7] The method according to [5] for producing a phase-separated pattern by a block copolymer, further comprising the step of forming an upper layer film on the block copolymer layer between step (1) and step (2).

[8] A process for manufacturing a semiconductor device, comprising the steps of:

(1) forming a block copolymer layer on a substrate using the self-assembly film-forming composition according to any one of [1] to [4], (2) separating the block copolymer layer formed on the substrate into phases, (3) etching the block copolymer layer separated into phases, and (4) etching the substrate.

[9] A laminate comprising, sequentially on a substrate:

(1) an underlayer film formed on the substrate, (2) a block copolymer layer comprising a block copolymer comprising a silicon-free polymer and a silicon-containing polymer bonded together, the silicon-containing polymer comprising a structural unit comprising styrene substituted with a silicon-containing group, wherein the silicon-free polymer comprises a unit structure represented by formula (1-1) or formula (1-2) below, and the silicon-containing group contains one silicon atom,

[Chemical Formula 4]

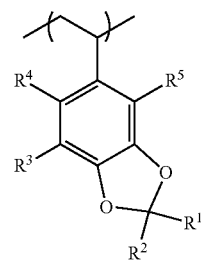

Formula (1-1)

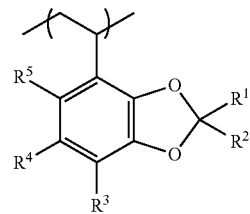

Formula (1-2)

(in formula (1-1) and formula (1-2), $R^1$ and $R^2$ are each independently a hydrogen atom, a halogen atom or a C1-C10 alkyl group; and $R^3$ to $R^5$ are each independently a hydrogen atom, a hydroxy group, a halogen atom, a C1-C10 alkyl group, a C1-C10 alkoxy group, a cyano group, an amino group, an amide group or a carbonyl group), and (3) an upper layer film.

Advantageous Effects of Invention

The self-assembly film-forming compositions of the present invention can form a block copolymer layer capable of giving rise to a perpendicular finer microphase-separated structure.

DESCRIPTION OF EMBODIMENTS

[Self-Assembly Film-Forming Composition]

Figure 1:
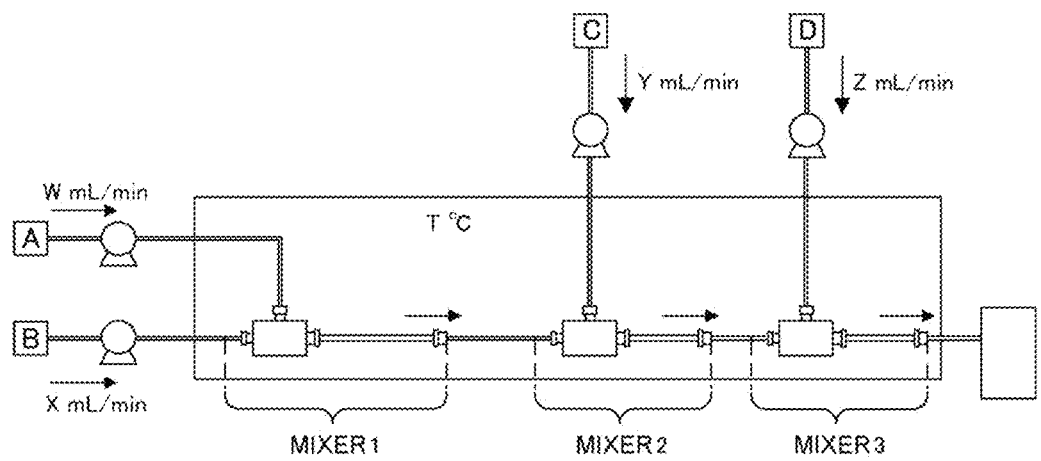
FIG. 1 is a schematic view of a flow reactor (a reaction apparatus) used in Synthetic Example 1.

A self-assembly film-forming composition of the present application contains a block copolymer and a solvent and it is for forming a phase-separated structure by a block copolymer layer on a substrate.

The composition may be produced by mixing a block copolymer and a solvent by a method known per se.

[Block Copolymer]

The block copolymer of the present application is a block copolymer in which a silicon-free polymer is bonded to a silicon-containing polymer containing a structural unit from styrene substituted with a silicon-containing group.

The silicon-free polymer contains a structure derived from the following formula (1-1) or formula (1-2).

[Chemical Formula 5]

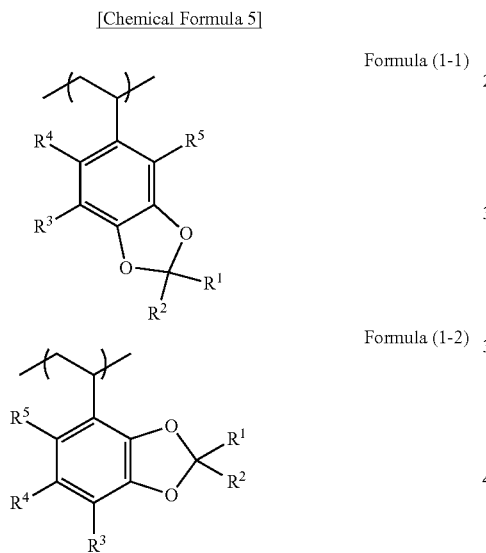

Formula (1-1)

Formula (1-2)

(In formula (1-1) and formula (1-2), $R^1$ and $R^2$ are each independently a hydrogen atom, a halogen atom or a C1-C10 alkyl group; and $R^3$ to $R^5$ are each independently a hydrogen atom, a hydroxy group, a halogen atom, a C1-C10 alkyl group, a C1-C10 alkoxy group, a cyano group, an amino group, an amide group or a carbonyl group.)

Examples of the halogen atom include fluorine, chlorine, bromine and iodine.

Examples of the C1-C10 alkyl group include linear, branched or cyclic alkyl groups having 1 to 10 carbon atoms, specifically, methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group and 2-ethyl-3-methyl-cyclopropyl group.

Specific examples of the C1-C10 alkoxy group include methoxy group, ethoxy group, n-propoxy group, i-propoxy group, n-butoxy group, i-butoxy group, s-butoxy group, t-butoxy group, n-pentoxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group and 1-ethyl-2-methyl-n-propoxy group.

Examples of the amide group include —$CONR^1R^2$ in which $R^1$ and $R^2$ are each a hydrogen atom or a group having any of the C1-C10 alkyl groups described above.

The silicon-containing group preferably contains one silicon atom. The silicon-containing polymer preferably contains a unit structure represented by the following formula (2).

[Chemical Formula 6]

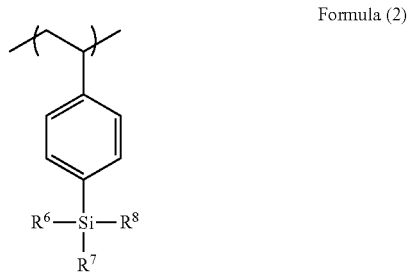

Formula (2)

(In formula (2), $R^6$ to $R^8$ are each independently a C1-C10 alkyl group or a C6-C40 aryl group.)

Further, as the block copolymer, any of the block copolymers described in JP 2019-507815 A may be used.

[1] Block copolymers containing 5-vinylbenzo[d][1,3] dioxole.

[2] The block copolymers according to [1] which further contain a silicon-containing block.

[3] The block copolymers according to [2] which further contain pentamethyldisilylstyrene.
[4] The block copolymers according to [3] which are poly(5-vinylbenzo[d][1,3]dioxole)-b-poly(pentamethyldisilylstyrene) copolymers. The synthesis of poly(5-vinylbenzo[d][1,3]dioxole-block-4-pentamethyldisilylstyrene) is illustrated below.

FIGURE 8

[Chemical Formula 7]

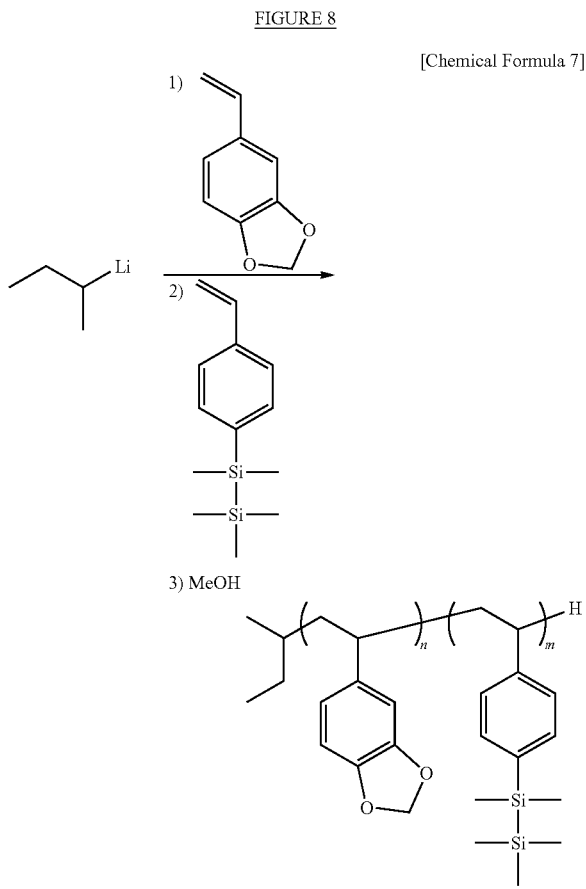

Preferably, the silicon-containing polymer or the silicon-containing block is poly(4-trimethylsilylstyrene) derived from 4-trimethylsilylstyrene. Preferably, the silicon-containing polymer or the silicon-containing block is poly(pentamethyldisilylstyrene) derived from pentamethyldisilylstyrene. The C6-C40 aryl groups are monocyclic or polycyclic, monovalent aromatic hydrocarbon groups having 6 to 40 carbon atoms, with specific examples including phenyl group, naphthyl group and anthryl group.

Specific examples of the C1-C10 alkoxy groups are the same as described above.

The self-assembly film-forming composition may have a solid content of 0.1 to 10% by mass, 0.1 to 5% by mass, or 0.1 to 3% by mass. The solid content is the proportion of the components of the film-forming composition except the solvent.

The proportion of the block copolymer in the solid content may be 30 to 100% by mass, 50 to 100% by mass, 50 to 90% by mass, or 50 to 80% by mass.

The block copolymer may contain two, or three or more different blocks. The number of blocks present in the block copolymer may be 2, or 3 or more.

Examples of the combinations of blocks in the polymer include AB, ABAB, ABA and ABC.

For example, the block copolymer may be synthesized by living radical polymerization or living cationic polymerization, which proceeds only through initiation reaction and growth reaction and is not accompanied by side reactions that inactivate the growth ends. The growth ends may remain reactive, that is, may keep growing during the polymerization reaction. By eliminating the occurrence of chain transfer, a polymer (A) having uniform molecular lengths may be obtained. When a dissimilar monomer (b) is added to the growth end of the polymer (A), monomer (b) is polymerized to form a block copolymer (AB).

The block copolymer of the present application may be produced using a flow reactor.

When, for example, the copolymer contains two different blocks, A and B, the molar ratio of polymer chain (A) to polymer chain (B) may be 1:9 to 9:1, or preferably 3:7 to 7:3.

The volume ratio in such a block copolymer of the present application is, for example, 30:70 to 70:30.

Homopolymer A or B is a polymerizable compound having at least one radically polymerizable reactive group (a vinyl group or a vinyl group-containing organic group).

The weight average molecular weight Mw of the block copolymer used in the present invention ranges preferably 1,000 to 100,000, or 5,000 to 100,000. When the weight average molecular weight is less than 1,000, the composition may exhibit poor applicability to a base substrate. When the weight average molecular weight is not less than 100,000, the solubility in the solvent may be low.

The polydispersity (Mw/Mn) of the block copolymer of the present application ranges preferably 1.00 to 1.50, and particularly preferably 1.00 to 1.20.

In formula (1-1) or formula (1-2), it is preferable that $R^1$ to $R^5$ be each independently selected from a hydrogen atom and a C1-C10 alkoxy group, that $R^1$ to $R^5$ be each independently selected from a hydrogen atom and a methoxy group, and that $R^1$ to $R^5$ be all hydrogen atoms.

In formula (2), it is preferable that $R^6$ to $R^8$ be each independently selected from C1-C5 linear alkyl groups, that $R^6$ to $R^8$ be each independently selected from a methyl group, an ethyl group and a propyl group, and that $R^6$ to $R^8$ be all methyl groups.

Specific examples of the block copolymer include poly(5-ethenyl-1,3-benzodioxole)-b-poly(trimethylsilylstyrene) block polymer (PMDOS-b-PTMSS).

[Solvent in Self-Assembly Film-Forming Composition]

For example, the solvent used in the self-assembly film-forming composition according to the present invention may be selected from the following solvents:

aliphatic hydrocarbon solvents such as n-pentane, i-pentane, n-hexane, i-hexane, n-heptane, i-heptane, 2,2,4-trimethylpentane, n-octane, i-octane, cyclohexane and methylcyclohexane;

aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene and trimethylbenzene;

monoalcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol and cresol;

polyhydric alcohol solvents such as ethylene glycol, propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol and glycerin;

ketone solvents such as acetone, methyl ethyl ketone, methyl-n-propyl ketone, methyl-n-butyl ketone, diethyl ketone, methyl-1-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone and fenchone;

ether solvents such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monomethyl ether acetate, propylene glycol monoethyl ether, propylene glycol monoethyl ether acetate, propylene glycol monopropyl ether, propylene glycol monopropyl ether acetate, propylene glycol monobutyl ether, propylene glycol monobutyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran and 2-methyltetrahydrofuran;

ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate and diethyl phthalate;

nitrogen-containing solvents such as N-methylformamide, N,N-dimethylformamide, N,N-diethylformamide, acetamide, N-methylacetamide, N,N-dimethylacetamide, N-methylpropionamide and N-methylpyrrolidone; and sulfur-containing solvents such as dimethyl sulfide, diethyl sulfide, thiophene, tetrahydrothiophene, dimethylsulfoxide, sulfolane and 1,3-propanesultone.

[Underlayer Film and Underlayer Film-Forming Composition]

The block copolymer layer is preferably applied onto an underlayer film containing a copolymer containing the following unit structures:

unit structure (A) derived from a styrene compound containing a tert-butyl group, unit structure (B) derived from an aromatic-containing vinyl compound containing no hydroxy group with the proviso that it is different from unit structure (A), and unit structure (C) derived from a compound containing a (meth)acryloyl group and no hydroxy groups.

It is preferable that the copolymer further contains a unit structure (D) derived from a crosslinking group-containing compound.

The copolymerization ratio relative to the entirety of the copolymer range preferably 25 to 90% by mole of (A), 0 to 65% by mole of (B), 0 to 65% by mole of (C), and 10 to 20% by mole of (D); and aromatic-containing unit structures preferably represent 81 to 90% by mole of (A)+(B)+(C).

The proportion of aromatic-containing unit structures ranges preferably 82 to 89% by mole, more preferably 83 to 88% by mole, and most preferably 83 to 86% by mole of (A)+(B)+(C).

[Synthesis of Copolymer for Underlayer Film]

The copolymer, which is contained in the underlayer film-forming composition used to cause phase separation of the block copolymer layer formed on a substrate according to the present invention, may be produced by copolymerizing various monomers described below in an appropriate molar ratio by a conventional method, for example, bulk polymerization, solution polymerization, suspension polymerization or emulsion polymerization. Solution polymerization is particularly preferable. In solution polymerization, for example, desired monomers may be polymerized by adding them into a solvent containing a polymerization initiator and additives.

In the present invention, the copolymer is not necessarily limited to a high-molecular compound, that is, the copolymer may be an oligomer but is not a monomer.

The monomers of each of the categories described below may be used each alone or in combination of two or more.

The underlayer film-forming composition may be produced by mixing the copolymer and a solvent by a method known per se.

[Monomer Used in Copolymer Contained in Underlayer Film]

[1. Styrene Compound Containing Tert-Butyl Group]

The tert-butyl group is substituted on the aromatic ring of styrene, and the number of tert-butyl groups ranges 1 to 5.

The compounds are preferably represented by the following formula (1'):

[Chemical Formula 8]

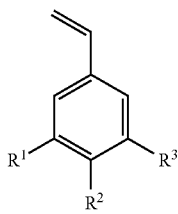

Formula (1')

(In formula (1'), one or two of $R^1$ to $R^3$ are tert-butyl groups.)

4-tert-Butylstyrene is more preferable.

[2. Aromatic-Containing Vinyl Compound Containing No Hydroxy Group]

The aromatic-containing vinyl compound containing no hydroxy group is an aromatic-containing vinyl compound that is different from the above styrene compound containing a tert-butyl group.

The compound is preferably represented by the following formula (4'-1) or (4'-2).

[Chemical Formula 9]

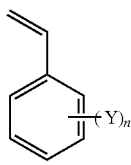

Formula (4'-1)

[Chemical Formula 10]

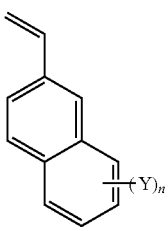

Formula (4'-2)

(In formulae (4'-1) and (4'-2), Y is a halogen atom, a C1-C10 alkyl group, a C1-C10 alkoxy group, a cyano group, an amide group, an alkoxycarbonyl group or a thioalkyl group; and n is an integer of 0 to 7.)

Examples of the halogen atoms include the halogen atoms described hereinabove.

Examples of the C1-C10 alkyl groups include the alkyl groups described hereinabove.

Examples of the amide groups include the amide groups described hereinabove.

Examples of the alkoxycarbonyl groups include groups resulting from bonding of a carbonyl group (—CO—) to the carbon atom at the end of the alkoxy groups described hereinabove. The structures of the alkoxycarbonyl groups are preferably linear or branched. Examples of such alkoxycarbonyl groups include methoxycarbonyl group, ethoxycarbonyl group, n-propoxycarbonyl group, isopropoxycarbonyl group, n-butoxycarbonyl group, isobutoxycarbonyl group, sec-butoxycarbonyl group, tert-butoxycarbonyl group, n-pentyloxycarbonyl group and n-hexyloxycarbonyl group.

Examples of the thioalkyl groups include groups corresponding to the alkoxy groups described hereinabove except that —O— is replaced by —S—. Examples of such thioalkyl groups include methylthio group, ethylthio group, n-propylthio group, i-propylthio group, n-butylthio group, i-butylthio group, s-butylthio group, t-butylthio group, 2-methylbutylthio group, n-pentylthio group and n-hexoxy group.

More preferred aromatic-containing vinyl compound containing no hydroxy group includes 2-vinylnaphthalene, styrene and 4-methoxystyrene.

[3. Compound Containing (Meth)Acryloyl Group and No Hydroxy Group]

The term "(meth)acryloyl group" indicates an acryloyl group and a methacryloyl group. The acryloyl group is a group represented by $CH_2=CH-CO-$, and the methacryloyl group is a group represented by $CH_2=C(R)-CO-$ (wherein R is a hydrocarbon group or the like).

The compounds are preferably represented by the following formula (5'-1) or (5'-2).

[Chemical Formula 11]

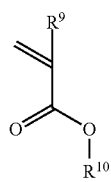

Formula (5'-1)

[Chemical Formula 12]

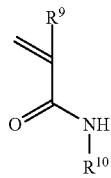

Formula (5'-2)

(In formulae (5'-1) and (5'-2), $R^9$ is a hydrogen atom or a methyl group; and $R^{10}$ is independently a hydrogen atom, a C1-C5 alkoxy group, a linear, branched or cyclic C1-C10 alkyl group optionally substituted with a halogen atom, a benzyl group or an anthrylmethyl group.)

The "C1-C10 alkoxy group", the "halogen atom" and the "C1-C10 alkyl group" are the same as described hereinabove.

Examples of the compounds containing a (meth)acryloyl group and no hydroxy groups include methyl (meth)acrylate, ethyl (meth)acrylate, n-hexyl (meth)acrylate, isopropyl (meth)acrylate, cyclohexyl (meth)acrylate, benzyl (meth)acrylate, anthrylmethyl (meth)acrylate, 2,2,2-trifluoroethyl (meth)acrylate, 2,2,2-trichloroethyl (meth)acrylate, 2-bromoethyl (meth)acrylate, 2-methoxyethyl (meth)acrylate, butoxy(2-ethyl) (meth)acrylate, 2-methyl-2-adamantyl (meth)acrylate, (meth)acrylamide, N-methyl(meth)acrylamide, N-ethyl(meth)acrylamide, N-benzyl(meth)acrylamide and N-anthryl(meth)acrylamide. Benzyl methacrylate is more preferable.

[4. Crosslinking Group-Containing Compound]

The crosslinking group is not particularly limited as long as the group form an intermolecular chemical bond. Examples thereof include hydroxy group, epoxy group, protected hydroxy group and protected carboxyl group. There may be any number of crosslinking groups in a molecule.

Examples of the hydroxy group include vinyl group-containing hydroxy group derived from hydroxyalkyl (meth)acrylate, vinyl alcohol and the like, and phenolic hydroxy group such as hydroxystyrenes. Examples of the alkyl group here include the alkyl groups described hereinabove such as, for example, methyl group, ethyl group, propyl group, isopropyl group and butyl group. In the present specification, the term (meth)acrylate means both methacrylate and acrylate.

Examples of the epoxy group include vinyl group-containing epoxy group derived from epoxy (meth)acrylates, glycidyl (meth)acrylates and the like.

Examples of the protected hydroxy group include hydroxystyrenes of which the hydroxy group is protected by a tertiary butoxy (tert-butoxy) group. Examples further include phenolic hydroxy group such as hydroxystyrenes of which the hydroxy group is protected by reaction with a vinyl ether compound, and alcoholic hydroxy group such as hydroxyethyl methacrylate of which the hydroxy group is protected by reaction with a vinyl ether compound. Examples of the vinyl ether compound include aliphatic vinyl ether compounds having a C1-C10 alkyl chain and a vinyl ether group such as methyl vinyl ether, ethyl vinyl ether, isopropyl vinyl ether, normal butyl vinyl ether, 2-ethylhexyl vinyl ether, tert-butyl vinyl ether and cyclohexyl vinyl ether, and cyclic vinyl ether compound such as 2,3-dihydrofuran, 4-methyl-2,3-dihydrofuran and 2,3-dihydro-4H-pyran.

Examples of the protected carboxyl group include (meth)acrylic acid and vinylbenzoic acid of which the carboxyl group is protected by reaction with a vinyl ether compound. Examples of the vinyl ether compound used here include the above vinyl ether compounds.

The compound is preferably represented by the following formula (2'-1), (2'-2), (3'-1) or (3'-2).

[Chemical Formula 13]

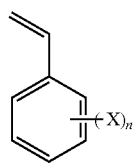

Formula (2'-1)

[Chemical Formula 14]

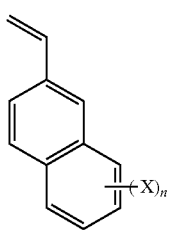

Formula (2'-2)

(In formulae (2'-1) and (2'-2), n quantity of X on the aromatic ring are each independently a hydroxy group, a halogen atom, an alkyl group, an alkoxy group, a cyano group, an amide group, an alkoxycarbonyl group or a thioalkyl group; and n is an integer of 1 to 7. In a preferred embodiment, at least one X is a hydroxy group.)

[Chemical Formula 15]

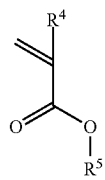

Formula (3'-1)

[Chemical Formula 16]

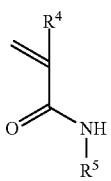

Formula (3'-2)

(In formulae (3'-1) and (3'-2),
R 4 is a hydrogen atom or a methyl group, and
$R^5$ is a linear, branched or cyclic C1-C10 alkyl group having a hydroxy group and optionally substituted with a halogen atom, or is a hydroxyphenyl group.)

The "halogen atom", the "C1-C10 alkyl group", the "C1-C10 alkoxy group", the "amide group", the "alkoxycarbonyl group" and the "thioalkyl group" are the same as described hereinabove.

More preferred compounds are 2-hydroxypropyl methacrylate, 2-hydroxyethyl methacrylate, N-(4-hydroxyphenyl) methacrylamide, 2-hydroethyl acrylate, 2-hydroxypropyl methacrylate and 4-hydroxybutyl (meth)acrylate.

The monomers described above may be produced by a conventional method and may also be commercially available.

[Solvent for Producing Copolymer for Underlayer Film]

The solvent that is used in the production of the copolymer to be contained in the underlayer film-forming composition of the present invention is not particularly limited as long as the solvent does not participate in the polymerization reaction and is compatible with the polymer. Specific examples thereof include aromatic hydrocarbons such as benzene, toluene and xylene; alicyclic hydrocarbons such as cyclohexane; aliphatic hydrocarbons such as n-hexane and n-octane; ketones such as acetone, methyl ethyl ketone and cyclohexanone; ethers such as tetrahydrofuran and dioxane; esters such as ethyl acetate and butyl acetate; amides such as N,N-dimethylformamide and N,N-dimethylacetamide; sulfoxides such as dimethylsulfoxide; alcohols such as methanol and ethanol; and polyhydric alcohol derivatives such as ethylene glycol monomethyl ether, ethylene glycol monomethyl ether acetate and propylene glycol monomethyl ether acetate. The solvent may be used each alone or in admixture of two or more. The amount of the solvent used may be selected appropriately.

The weight average molecular weight of the copolymer contained in the underlayer film-forming composition and in the underlayer film of the present application as determined by GPC (gel permeation chromatography) is variable depending on factors such as the type of the solvent used in the composition, and the solution viscosity. The weight average molecular weight in terms of standard polystyrene ranges 1,000 to 50,000, for example, and preferably 2,000 to 20,000.

[Preparation of Underlayer Film-Forming Composition]

The underlayer film-forming composition according to the present invention may be obtained by adding additives to the copolymer obtained as described above, and dissolving the resultant mixture into an appropriate solvent. The composition is preferably filtered through a microfilter after dissolving the components into a solvent. More preferably, the composition obtained by dissolving the components into a solvent is filtered through a microfilter having a pore size of 0.2 µm or less, and most preferably it is filtered through a microfilter having a pore size of 0.2 µm.

[Additives Contained in Underlayer Film-Forming Composition]

The underlayer film-forming composition for forming an underlayer film of the present invention may further include a crosslinking compound and a sulfonic acid compound. The sulfonic acid compound acts as a crosslinking accelerator. The ratio of the sulfonic acid compound relative to the copolymer contained in the underlayer film-forming composition of the present invention is not particularly limited, but is, for example, not less than 0.1% by mass and not more than 13% by mass, and preferably not less than 0.5% by mass and not more than 5% by mass. The crosslinking compound is also referred to as a crosslinking agent, and is, for example, a nitrogen-containing compound having two to four nitrogen atoms substituted with a methylol group or an alkoxymethyl group. The ratio of the crosslinking compound relative to the copolymer contained in the underlayer film-forming composition of the present invention is not particularly limited, but is, for example, not less than 5% by mass and not more than 50% by mass.

Preferred specific examples of the sulfonic acid compounds include p-toluenesulfonic acid, 4-hydroxybenzenesulfonic acid, trifluoromethanesulfonic acid, pyridinium-p-toluenesulfonic acid, pyridinium-4-hydroxybenzenesulfonic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid and pyridinium-1-naphthalenesulfonic acid.

Preferred specific examples of the crosslinking compounds (crosslinking agents) include hexamethoxymethylmelamine, tetramethoxymethyl glycoluril, tetramethoxymethylbenzoguanamine, 1,3,4,6-tetrakis(methoxymethyl) glycoluril, 1,3,4,6-tetrakis(butoxymethyl) glycoluril, 1,3,4,6-tetrakis(hydroxymethyl) glycoluril, 1,3-bis(hydroxymethyl)urea, 1,1,3,3-tetrakis(butoxymethyl)urea and 1,1,3,3-tetrakis(methoxymethyl)urea. Tetramethoxymethyl glycoluril is more preferable, and 1,3,4,6-tetrakis (methoxymethyl) glycoluril is most preferable.

The underlayer film-forming composition of the present invention may include a surfactant. Surfactants are additives for enhancing the applicability to substrates. Known surfactants such as nonionic surfactants and fluorosurfactants may be used. The surfactant may be added in a ratio of, for example, not less than 0.1% by mass and not more than 5% by mass relative to the copolymer contained in the underlayer film-forming composition of the present invention.

When the components in the underlayer film-forming composition of the present invention except the solvent is defined as solid components, the solid components include the copolymer and the above-mentioned various additives added as required.

The concentration of the solid components in the underlayer film-forming composition ranges, for example, 0.1% by mass to 15% by mass, and preferably 0.1% by mass to 10% by mass.

[Solvent for Underlayer Film-Forming Composition]

Specific examples of the solvent contained in the underlayer film-forming compositions of the present invention include propylene glycol monomethyl ether (PGME), propylene glycol monomethyl ether acetate (PGMEA), propylene glycol monopropyl ether, methyl ethyl ketone, ethyl lactate, cyclohexanone, N,N-2-trimethylpropionamide, γ-butyrolactone, N-methylpyrrolidone, methyl 2-hydroxyisobutyrate, ethyl 3-ethoxypropionate, and mixtures of two or more solvents selected from the above solvents. The solvent used in the preparation of the copolymer may remain present in the composition.

The ratio of the solvent relative to the underlayer film-forming composition of the present invention is not particularly limited, but is, for example, not less than 90% by mass and not more than 99.9% by mass.

The underlayer film and the underlayer film-forming composition used in the present invention include, for example, those underlayer films and underlayer film-forming compositions for forming microphase-separated patterns which are described in WO 2018/135455.

[Method for Producing Phase-Separated Pattern from Block Copolymer]

A method for producing a phase-separated pattern by a block copolymer according to the present invention includes the steps of: (1) forming an underlayer film on a substrate using the underlayer film-forming composition of the present invention, (2) forming a block copolymer layer on the underlayer film, and (3) separating the block copolymer layer formed on the underlayer film into phases.

The method may further include the step of forming an upper layer film on the block copolymer layer between step (2) of the formation of the block copolymer layer and step (3) of the phase separation of the block copolymer layer.

[Step of Forming Underlayer Film on Substrate]

[1. Substrate]

The substrate is selected from the group consisting of silicon, silicon oxide, glass, surface-modified glass, plastics, ceramics, transparent base materials, flexible base materials, base materials used in roll-to-roll processing, and combinations thereof. It is preferably silicon wafers, quartz, glass and plastics, and more preferably silicon wafers. A typical semiconductor substrate would be silicon wafers, and SOI (silicon on insulator) substrates and compound semiconductor wafers such as gallium arsenide (GaAs), indium phosphide (InP) and gallium phosphide (GaP) may also be used. Semiconductor substrates having an insulating film such as a silicon oxide film, a nitrogen-containing silicon oxide film (an SiON film) or a carbon-containing silicon oxide film (an SiOC film) may be used. In this case, the underlayer film-forming composition according to the present invention is applied onto the insulating film.

[2. Step of Forming Underlayer Film]

An underlayer film is formed on the substrate in order to obtain neutral surface energy. The underlayer film-forming composition is applied onto the substrate by a conventional technique such as spin coating so as to have a predetermined film thickness, and the substrate with the film is thereafter subjected to treatments such as heating and soaking as required.

The underlayer film-forming composition according to the present invention may be applied by a conventional technique, for example, by using an appropriate applicator such as a spinner or a coater.

The wet film obtained as described above is baked to give an underlayer film. Regarding the baking conditions, the baking temperature is appropriately selected within the range of from 80 to 500° C., or 80° C. to 350° C., and the baking time is appropriately selected within the range of from 0.3 to 60 minutes. Preferably, the baking temperature is 100° C. to 250° C., and the baking time is 0.5 to 2 minutes. The film thickness of the underlayer film formed here is, for example, 3 to 100 nm, preferably 3 to 50 nm, and particularly preferably 5 to 20 nm.

[Step of Forming Block Copolymer Layer on Underlayer Film]

A block copolymer layer is formed on the underlayer film. The block copolymer layer may be formed by applying the self-assembly film-forming composition containing a block copolymer onto the underlayer film by a conventional method such as, for example, spin coating with a predetermined film thickness, and calcining the wet film.

[Step of Forming Upper Layer Film on Block Copolymer Layer]

An upper layer film is optionally formed on the block copolymer layer obtained above. The upper layer film may be formed by a known method, specifically, by applying an upper layer film-forming composition on the underlayer film, and calcining the wet film.

The upper layer film-forming composition is applied onto the block copolymer layer by a conventional technique such as spin coating, thereby forming an upper layer film. The film thickness of the upper layer film that is formed is not particularly limited, but is generally 3 nm to 100 nm, preferably 10 to 70 nm, and particularly preferably 20 to 60 nm. If the film thickness is not more than 3 nm, the block copolymer may not be phase-separated into a desired uniform pattern. If the film thickness is not less than 100 nm, the amount of etching time may be disadvantageously extended. The upper layer film-forming composition is preferably a solution in a solvent or a solvent mixture which neither damage nor dissolve the block copolymer and which does not substantially swell the block copolymer.

An upper layer film-forming composition suitable for carrying out the present invention will be described below.

[Upper Layer Film-Forming Composition]

An upper layer film-forming composition suitable for carrying out the present invention is used to cause the block copolymer layer formed on the substrate to separate into phases. For example, the upper layer film-forming composition includes:

(A) a copolymer that includes unit structures (a) derived from a maleimide structure and from a styrene structure, and (B) a C8-C16 ether compound as a solvent.

This upper layer film-forming composition may be used in such a manner that the composition is applied to form a film on the block copolymer thin film, then the orientation of the block copolymer is controlled by heating, and the upper layer film is removed. Use of an upper layer film formed from this composition even permits orientation of a block copolymer layer that cannot be oriented by simple heating.

[(A) Copolymer (for Upper Layer Films and Upper Layer Film-Forming Composition)]
[Copolymers Including Unit Structures (a) Derived from Maleimide Structure and from Styrene Structure]

In the present specification, the terms "maleimide structure" and "styrene structure" indicate chemical structures that have a maleimide or a styrene as the scaffold, respectively. The phrase "unit structure derived from" means that the unit structure is a repeating unit derived from a compound having a maleimide structure or a styrene structure while maintaining the scaffold of the respective structures, which forms the main chain of the copolymer.

Preferably, the unit structure derived from a maleimide structure is represented by formula (11):

[Chemical Formula 17]

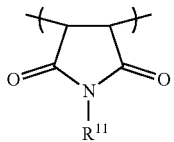

Formula (11)

(In formula (11), $R^{11}$ is a hydrogen atom, a linear, branched or cyclic C1-C10 alkyl group, or a C6-C10 aryl group optionally substituted with a halogen atom.)

Preferably, the unit structure derived from a styrene structure is represented by formula (12):

[Chemical Formula 18]

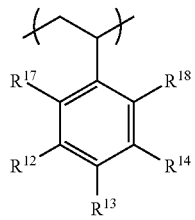

Formula (12)

(In formula (12), $R^{12}$ to $R^{14}$, $R^{17}$ and $R^{18}$ are each independently a hydrogen atom, a C1-C5 alkoxy group, or a linear, branched or cyclic C1-C10 alkyl group optionally substituted with a halogen atom.) $R^7$ and $R^8$ are preferably hydrogen atoms.

In copolymer (A), the molar ratios of the unit structures represented by formulae (11) and (12) relative to the entirety of copolymer (A) are desirably:
  to 30 70% by mole of the structural units of formula (11), and
  20 to 50% by mole of the structural units of formula (12).

[Unit Structure (b) Derived from (Meth)Acrylic Group]

Copolymer (A) may further include a unit structure (b) derived from a (meth)acrylic group in addition to the unit structures of formulae (11) and (12).

In the present invention, the term (meth)acrylic group means both an acrylic group and a methacrylic group. The term (meth)acrylate compound means both an acrylate compound and a methacrylate compound. For example, (meth)acrylic acid means acrylic acid and methacrylic acid.

Preferably, the unit structure derived from a (meth)acrylic group is represented by formula (13):

[Chemical Formula 19]

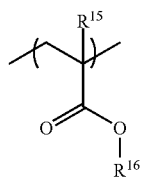

Formula (13)

(In formula (13), $R^{15}$ and $R^{16}$ are each independently a hydrogen atom, a C1-C5 alkoxy group, or a linear, branched or cyclic C1-C10 alkyl group optionally substituted with a halogen atom.)

In copolymer (A), the molar ratio of the unit structure of formula (13) relative to the entirety of copolymer (A) ranges 0.1 to 50% by mole, more preferably 0.1 to 30% by mole, still more preferably 0.1 to 20% by mole, and most preferably 0.1 to 10% by mole.

Examples of the C6-C40 aryl groups in the above formulae (11), (12) and (13) include phenyl group, benzyl group and naphthyl group.

The distribution of the unit structures represented by formulae (11), (12) and (13) in copolymer (A) is not particularly limited. That is, the unit structures represented by formulae (11) and (12) may be copolymerized alternately or randomly in copolymer (A). When the unit structure represented by formula (13) is present, the unit structures represented by formulae (11), (12) and (13) may form respective blocks or may be bonded randomly in copolymer (A).

The numbers of repetitions of the unit structures represented by formulae (11), (12) and (13) in copolymer (A) may be selected appropriately while ensuring that the molar percentage of each of the unit structures falls within the ranges described above, and the weight average molecular weight Mw of copolymer (A) is in the range of 5,000 to 500,000, preferably 10,000 to 100,000.

[Method for Producing Copolymer (A) (for Upper Layer Film and Upper Layer Film-Forming Composition)]

A method for producing copolymer (A) suitable for carrying out the present invention may include the step of copolymerizing a monomer mixture containing a compound represented by formula (14):

[Chemical Formula 20]

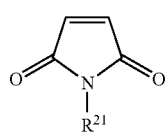

Formula (14)

(in formula (14), $R^{21}$ is a hydrogen atom, a linear, branched or cyclic C1-C10 alkyl group, or a C6-C40 aryl group optionally substituted with a halogen atom) and a compound represented by formula (15):

[Chemical Formula 21]

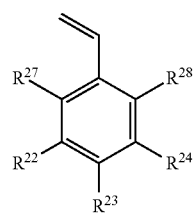

Formula (15)

(in formula (15), $R^{22}$ to $R^{24}$, $R^{27}$ and $R^{28}$ are each independently a hydrogen atom, a C1-C5 alkoxy group, or a linear, branched or cyclic C1-C10 alkyl group optionally substituted with a halogen atom). $R^9$ and $R^{10}$ are preferably hydrogen atoms.

Into the monomer mixture, a compound represented by formula (16):

[Chemical Formula 22]

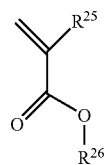

Formula (16)

(in formula (16), $R^{25}$ and $R^{26}$ are each independently a hydrogen atom, a C1-C5 alkoxy group, or a linear, branched or cyclic C1-C10 alkyl group optionally substituted with a halogen atom) may optionally be incorporated.

The "alkyl group", the "aryl group", the "alkoxy group" and the "halogen atom" are the same as described hereinabove.

The monomer mixture preferably contains the compounds represented by formulae (14) and (15) in the following proportions relative to the entirety of copolymer (A):

30 to 70% by mole of the compound represented by formula (14), and 20 to 50% by mole of the compound represented by formula (15).

When the compound represented by formula (16) is used, the monomer mixture preferably contains the compounds in the following proportions relative to the entirety of copolymer (A):

30 to 70% by mole of the compound represented by formula (14), 20 to 50% by mole of the compound represented by formula (15), and 0.1 to 40% by mole of the compound represented by formula (16).

Specific examples of the compounds represented by formula (14) include the following.

[Chemical Formula 23]

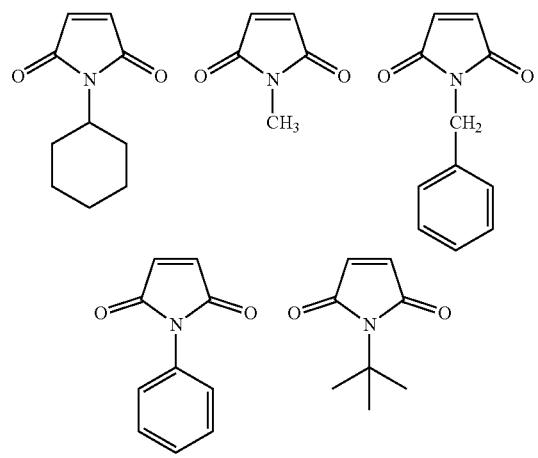

Specific examples of the compounds represented by formula (15) include the following.
[Chemical Formula 24]
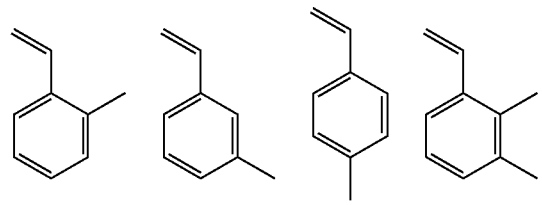
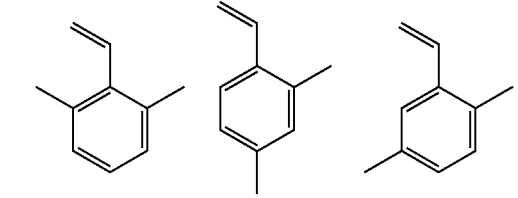
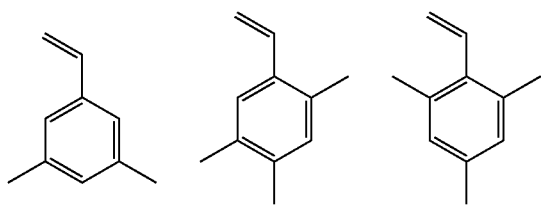
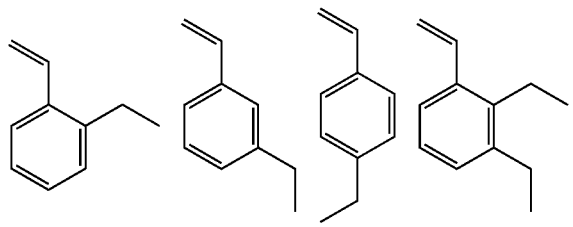
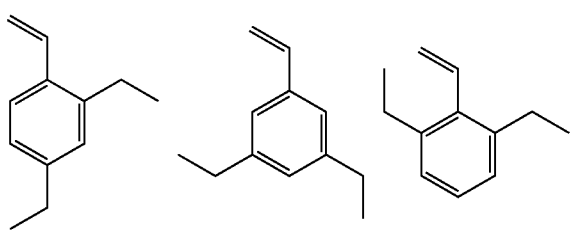
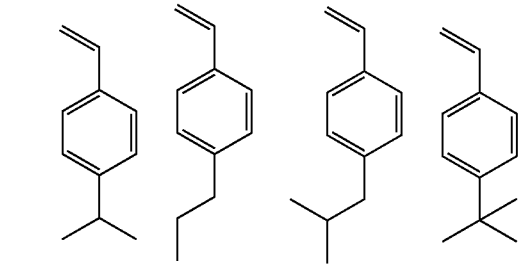
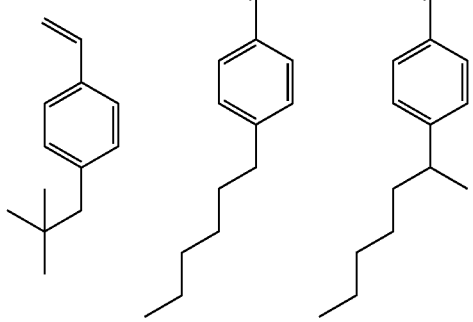
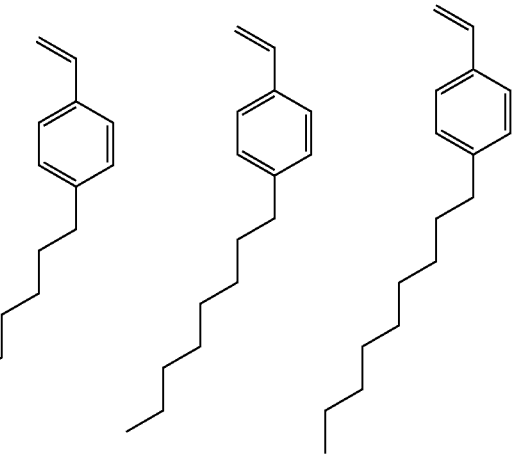
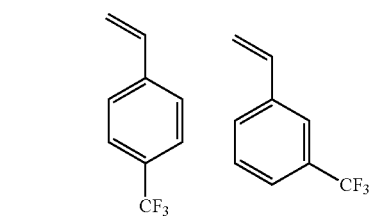
[Chemical Formula 25]
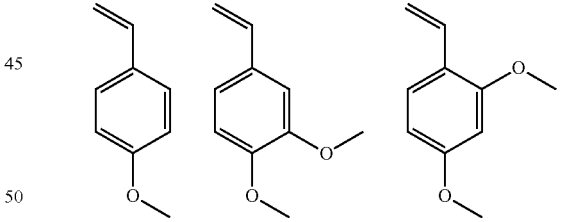
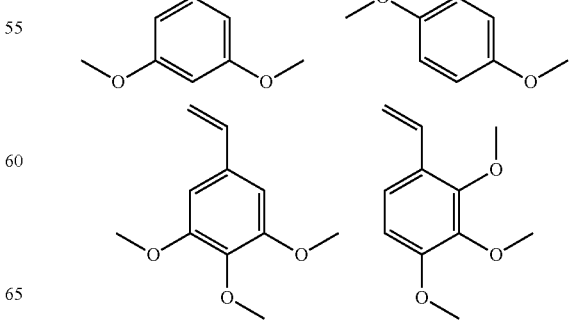

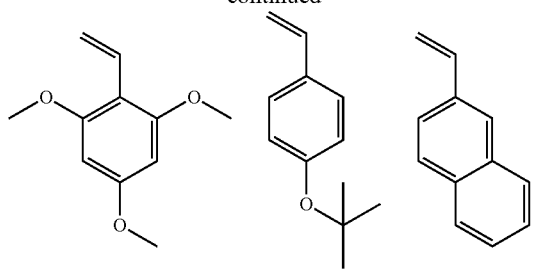

Specific examples of the compounds represented by formula (16) include the following.

[Chemical Formula 26]

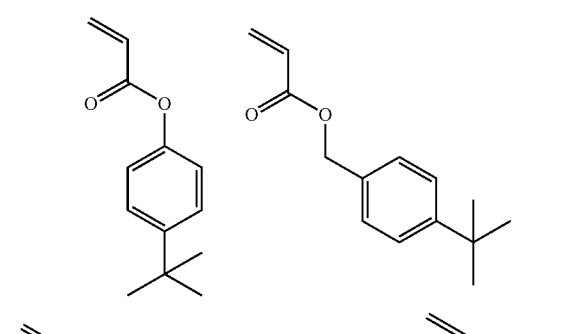

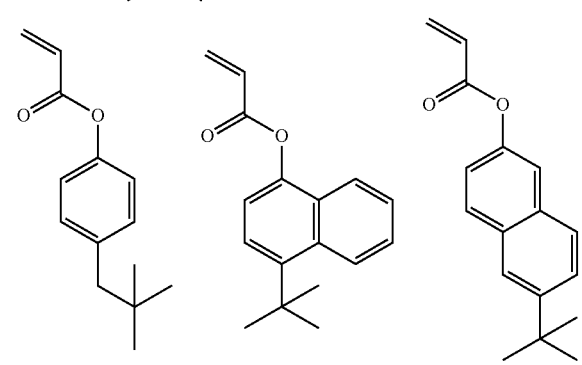

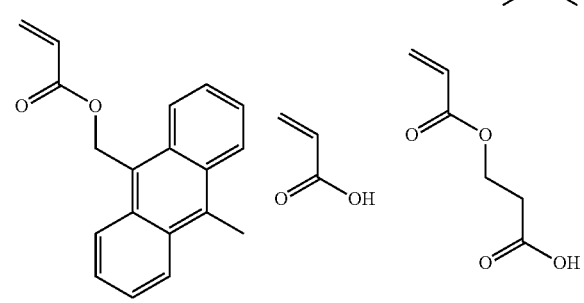

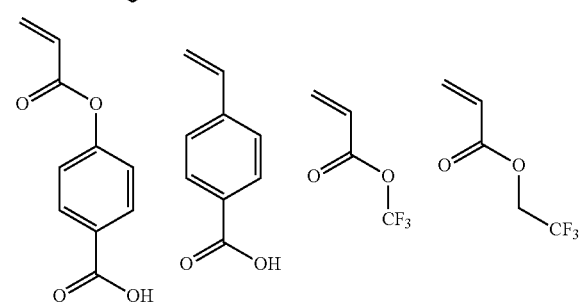

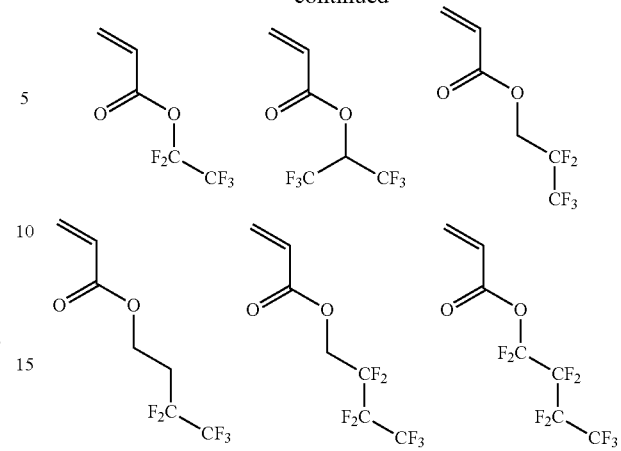

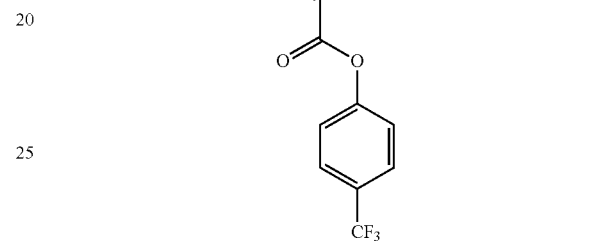

[Chemical Formula 27]

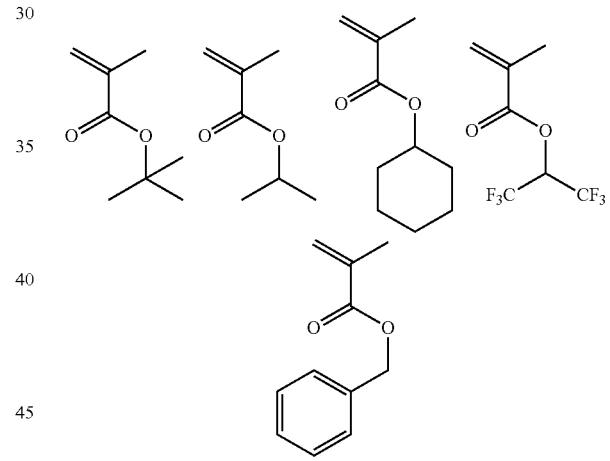

Copolymer (A) may be obtained by a known polymerization method. Examples of known polymerization methods include radical polymerization, anionic polymerization and cationic polymerization. Various known techniques such as solution polymerization, suspension polymerization, emulsion polymerization and bulk polymerization may be used.

Examples of the solvent used in the polymerization include dioxane, ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate and butyl lactate. The solvent may be used each alone or in admixture.

Copolymer (A) suitable for carrying out the present invention may be obtained by reacting the monomers at 50° C. to 200° C. for 1 hour to 48 hours while stirring.

The solution containing copolymer (A) thus obtained may be used directly for the preparation of the upper layer film-forming composition. Alternatively, the solution may be added to a poor solvent such as methanol, ethanol, isopropanol or water, or a mixture of such solvents to precipitate copolymer (A), which is then separated and recovered for use.

After having been isolated, copolymer (A) may be used directly by being redissolved into a C8-C16 ether compound described later, or may be used after being dried. When the copolymer is dried, the drying conditions are preferably oven drying or the like at 30 to 100° C. for 6 to 48 hours. After having been recovered, copolymer (A) may be redissolved into a C8-C16 ether compound described later to give a composition, which may be suitably used as an upper layer film-forming composition for carrying out the present invention.

The weight average molecular weight of copolymer (A) suitable for carrying out the present invention as determined by gel permeation chromatography (GPC) is variable depending on factors such as the type of a solvent used in the composition, and the solution viscosity. For example, the weight average molecular weight in terms of standard polystyrene ranges 5,000 to 500,000, and preferably 10,000 to 100,000.

[(B) Solvent for Upper Layer Film-Forming Composition]

The solvent used in the upper layer film-forming composition suitable for carrying out the present invention is a C8-C16 ether compound. More specifically, the C8-C16 ether compound used as the solvent in the composition suitable for carrying out the present invention (hereinafter, the ether compound is sometimes referred to as the "ether solvent") is represented by the following formula (6).

[Chemical Formula. 28]

Formula (6)

In formula (6), $A_1$ and $A_2$ are each independently an optionally substituted, linear, branched or cyclic, saturated C1-C15 alkyl group.

In particular, some preferred solvents are dibutyl ether, diisobutyl ether, di-tert-butyl ether, dipentyl ether, diisoamyl ether, dihexyl ether, dioctyl ether and cyclopentyl methyl ether, which are all excellent in the balance between the solubility of copolymer (A) and the insolubility of the block copolymer suitable for carrying out the present invention. More preferred solvents are dibutyl ether, diisobutyl ether and diisoamyl ether. Diisoamyl ether is particularly preferable. The ether solvent may be used each alone or in admixture.

For the convenience for the synthesis of copolymer (A) suitable for carrying out the present invention, for example, the composition may contain an organic solvent together with the ether solvent. Such a solvent is, for example, the solvent described in the section of the method for producing copolymer (A). The proportion of such a solvent other than the ether solvent may be in the range of 0.01 to 20% by mass relative to the ether solvent.

[Additives for Upper Layer Film-Forming Composition]

The upper layer film-forming composition suitable for carrying out the present invention may further include additives such as a surfactant and a rheology modifier.

A rheology modifier may be added primarily for the purpose of enhancing the fluidity of the composition suitable for carrying out the present invention. Specific examples thereof include phthalic acid derivatives such as dimethyl phthalate, diethyl phthalate, diisobutyl phthalate, dihexyl phthalate and butyl isodecyl phthalate, adipic acid derivatives such as di-normal butyl adipate, diisobutyl adipate, diisooctyl adipate and octyl decyl adipate, maleic acid derivatives such as di-normal butyl maleate, diethyl maleate and dinonyl maleate, oleic acid derivatives such as methyl oleate, butyl oleate and tetrahydrofurfuryl oleate, and stearic acid derivatives such as normal butyl stearate and glyceryl stearate. The rheology modifier is usually added in a proportion of less than 30% by mass based on 100% by mass of the entirety of the composition suitable for carrying out the present invention.

The upper layer film-forming composition suitable for carrying out the present invention may include a surfactant to eliminate the occurrence of defects such as pinholes and striations and to attain further enhancement in applicability with respect to uneven surfaces. Examples of the surfactants include nonionic surfactants such as polyoxyethylene alkyl ethers including polyoxyethylene lauryl ether, polyoxyethylene stearyl ether, polyoxyethylene cetyl ether and polyoxyethylene oleyl ether, polyoxyethylene alkylaryl ethers including polyoxyethylene octylphenol ether and polyoxyethylene nonylphenol ether, polyoxyethylene/polyoxypropylene block copolymers, sorbitan fatty acid esters including sorbitan monolaurate, sorbitan monopalmitate, sorbitan monostearate, sorbitan monooleate, sorbitan trioleate and sorbitan tristearate, and polyoxyethylene sorbitan fatty acid esters including polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate, fluorosurfactants such as EFTOP series EF301, EF303 and EF352 (manufactured by Tohkem Products Corp.), MEGAFACE series F171 and F173 (manufactured by DIC CORPORATION), FLUORAD series FC430 and FC431 (manufactured by Sumitomo 3M Limited), Asahi Guard AG710 and SURFLON series S-382, SC101, SC102, SC103, SC104, SC105 and SC106 (manufactured by AGC Inc.), and FTERGENT series (manufactured by NEOS COMPANY LIMITED), and organosiloxane polymer KP341 (manufactured by Shin-Etsu Chemical Co., Ltd.). The surfactant is usually added in an amount of not more than 0.2% by mass, preferably not more than 0.1% by mass based on 100% by mass of the entirety of the upper layer film-forming composition suitable for carrying out the present invention. The surfactant may be added each alone or in combination of two or more.

The content of copolymer (A) relative to the solid components in the composition is preferably not less than 20% by mass, for example, 20 to 100% by mass, or 30 to 100% by mass. The content of the solid components in the composition suitable for carrying out the present invention ranges preferably 0.1 to 50% by mass, and more preferably 0.3 to 30% by mass. Here, the solid components are the components in the upper layer film-forming composition except the solvent components.

The upper layer film-forming composition suitable for carrying out the present invention may be produced by mixing copolymer (A), the C8-C16 ether compound as the solvent, and optionally the additives described above according to the formulation described hereinabove, while stirring at, for example, room temperature to 40° C.

The upper layer film and the upper layer film-forming composition used in the present invention include, for example, those upper layer films and upper layer film-forming compositions described in WO 2018/051907.

[Laminate]

A laminate contains, sequentially on a substrate:
(1) the above-described underlayer film formed on the substrate,
(2) a block copolymer layer including a block copolymer containing a silicon-free polymer and a silicon-containing polymer bonded together, the silicon-containing polymer containing a structural unit from styrene substituted with a silicon-containing group, wherein the silicon-free polymer contains a unit structure represented by formula (1-1) or formula (1-2) below, and the silicon-containing group contains one silicon atom,

[Chemical Formula 29]

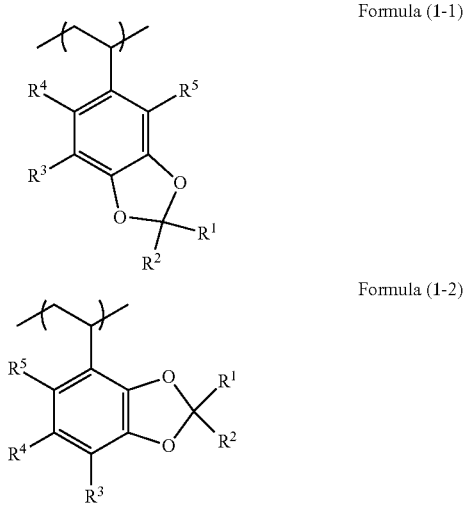

Formula (1-1)

Formula (1-2)

(in formula (1-1) and formula (1-2), $R^1$ and $R^2$ are each independently a hydrogen atom, a halogen atom or a C1-C10 alkyl group; and $R^3$ to $R^5$ are each independently a hydrogen atom, a hydroxy group, a halogen atom, a C1-C10 alkyl group, a C1-C10 alkoxy group, a cyano group, an amino group, an amide group or a carbonyl group), and
(3) the above-described upper layer film.

[Step of Phase Separation of Block Copolymer Layer Disposed on Underlayer Film]

The block copolymer layer may be separated into phases by rearranging the materials constituting the block copolymer preferably in the presence of the upper layer film, for example, by ultrasonication treatment, solvent treatment, thermal annealing or the like. In many applications, it is desirable that the block copolymer layer be separated into phases by simple heating or by the so-called thermal annealing. Thermal annealing may be performed in the air or an inert gas under normal pressure, reduced pressure or increased pressure conditions.

The thermal annealing may be performed under any conditions without limitation, but is preferably carried out in the air at 180° C. to 300° C., particularly preferably at 190 to 240° C., and most preferably at 210° C.

The treatment time is not particularly limited, but is usually 1 to 30 minutes, and preferably 3 to 10 minutes.

The phase separation of the block copolymer layer results in the formation of block copolymer domains oriented substantially perpendicularly to the plane of the substrate or the underlayer film. The morphology of the domains is, for example, lamellar, spherical, columnar or the like. The domain interval is, for example, 50 nm or less. By the method of the present invention, it is possible to form a structure having desired size, shape, orientation and periodicity.

The upper layer film may be peeled off after the block copolymer layer has been separated into phases. For example, the upper layer film may be peeled using a solvent or a mixture of solvents (peeling solvents) that neither damage nor dissolve the block copolymer and that does not substantially swell the block copolymer. The upper layer film composition that has been peeled may be isolated and reused. The isolation may be performed in a conventional manner such as, for example, precipitation or distillation.

[Process for Manufacturing Semiconductor Device]

The block copolymer layer that has been separated into phases by the method described above may be further subjected to an etching step. Part of the phase-separated block copolymer is usually removed before etching. The etching may be performed by a known technique. This process may be used for the manufacture of semiconductor substrates.

Specifically, a process for manufacturing a semiconductor device according to the present invention includes the steps of: (1) forming an underlayer film on a substrate using the underlayer film-forming composition of the present invention, (2) forming a block copolymer layer on the underlayer film, (3) separating the block copolymer layer formed on the underlayer film into phases, (4) etching the block copolymer layer separated into phases, and (5) etching the substrate.

The etching may be performed using a gas. Examples of the gas include tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, trichloroborane and dichloroborane. It is preferable to use a halogen-containing gas, and it is more preferable to use a fluorine-containing gas. Examples of the fluorine-containing gas include tetrafluoromethane ($CF_4$), perfluorocyclobutane ($C_4F_8$), perfluoropropane ($C_3F_8$), trifluoromethane and difluoromethane ($CH_2F_2$).

The pattern of the phase-separated block copolymer layer formed using the upper layer film-forming composition according to the present invention allows a predetermined shape to be etched in a substrate to be worked. A desired semiconductor device may be thus manufactured.

EXAMPLES

The present invention will be described in more detail by presenting Examples and Comparative Example hereinbelow. However, it should be construed that the scope of the present invention is not limited to such Examples below.

The weight average molecular weight (Mw) of polymer (A) described in Synthetic Example 1 below is a result measured by a gel permeation chromatography (GPC) method. The measurement conditions are as follows.

GPC column: PLgel 3 µm MIXED-E (manufactured by Agilent Technologies)
Column temperature: 40° C.
Solvent: Tetrahydrofuran (THF)
Flow rate: 1.00 ml/min
Detector: RI detector
Standard samples: Polystyrene

[Synthetic Example 1] Synthesis of Block Copolymer

FIG. 1 is a schematic view of a flow reactor (a reaction apparatus) used in the following synthesis example. In FIG. 1, the arrows indicate the direction in which a liquid flows. Plunger pump A (KP-12 or HP-12 manufactured by FLOM Corp.) was used for the feeding of a first monomer liquid. The plunger pump A was connected to mixer 1 through a PTFE tube (inner diameter: 1.0 mm, outer diameter: 1.6 mm, length: 2 m). Syringe pump B (Keychem-L manufactured by YMC CO., LTD.) was used for the feeding of an initiator solution. The syringe pump B was connected to mixer 1 through a PTFE tube (inner diameter: 1.0 mm, outer diameter: 1.6 mm, length: 2 m). The outlet of mixer 1 was connected to one inlet of mixer 2 through a PFA tube (inner diameter: 2.0 mm, outer diameter: 3 mm, length: 2 m). The other inlet of mixer 2 was connected to syringe pump C (Keychem-L manufactured by YMC Co., Ltd.) for the feeding of a second monomer liquid through a PTFE tube (inner diameter: 1.0 mm, outer diameter: 1.6 mm, length: 2 m). The outlet of mixer 2 was connected to one inlet of mixer 3 through a PFA tube (inner diameter: 2.0 mm, outer diameter: 3 mm, length: 2 m). The other inlet of mixer 3 was connected to syringe pump D (Asia manufactured by Syrris) for the feeding of a polymerization terminator solution through a PTFE tube (inner diameter: 1.0 mm, outer diameter: 1.6 mm, length: 2 m). A PFA tube (inner diameter: 2.0 mm, outer diameter: 3 mm, length: 0.7 m) was connected to the outlet of mixer 3. Flow channels extending from ahead of the respective pumps to 90% of the length of the tube connected to the outlet of mixer 3 were immersed in a constant temperature bath at −20° C. to control the temperature. Mixers 1 and 2 used for the synthesis were two-liquid mixers described in WO 2017/135398, which had a double tube structure [composed of static mixer elements DSP-MXA3-17 manufactured by NORITAKE CO., LIMITED (polyacetal elements, number of twisted blades: 17, diameter: 3 mm), stainless steel joint members and stainless steel cylindrical bodies]. Mixer 3 was a general simple double-tube mixer. The pumps and the mixers were connected in such a manner that the first monomer solution tube was connected to the inlet of the introduction hole of mixer 1, and the initiator solution tube was connected to the inlet of the inner pipe of mixer 1; the tube connected to the outlet of mixer 1 was connected to the inlet of the introduction hole of mixer 2, and the second monomer liquid tube was connected to the inlet of the inner pipe of mixer 2; and the polymerization terminator solution tube was connected to the inlet of the introduction hole of mixer 3, and the tube connected to the outlet of mixer 2 was connected to the inlet of the inner pipe of mixer 3.

Synthesis of poly(5-ethenyl-1,3-benzodioxole)-b-poly(trimethylsilylstyrene) Block Polymer (PMDOS-b-PTMSS)

A 0.5 mol/L THF solution of 5-ethenyl-1,3-benzodioxole as a first monomer, and a 0.05 mol/L hexane solution of n-butyllithium as an initiator were mixed together in mixer 1 at flow rates of 10 mL/min and 1.5 mL/min, respectively, and thereby the first monomer was polymerized. Subsequently, 4-trimethylsilylstyrene liquid as a second monomer was mixed in mixer 2 at 0.66 mL/min and was polymerized to form a block copolymer. Subsequently, a 0.25 mol/L THF solution of methanol as a polymerization terminator was mixed in mixer 3 at 10 mL/min to terminate the polymerization. The pumps were operated for 12 minutes to flow the liquid, and the liquid that flowed out was collected.

Further, 216 g of the above effluent liquid was distilled in an evaporator to remove the solvents. The resultant distillate weighing 78 g was added dropwise to 750 g of methanol at room temperature. The white suspension thus obtained was filtered through a 1.0 µm membrane filter, and the filter cake was washed with 158 g of methanol. Subsequently, the white solid thus obtained was dried under reduced pressure (50° C., 3.5 hours) to give 16 g of PMDOS-b-PTMSS. GPC analysis showed that the polymer obtained had Mn of 20,700 and Mw/Mn of 1.11. From the results of $^1$H-NMR of the polymer, the compositional ratio of 5-ethenyl-1,3-benzodioxole units to trimethylsilylstyrene units was 61:39 (5-ethenyl-1,3-benzodioxole units:trimethylsilylstyrene units). 12.72 g of PMDOS-b-PTMSS obtained above was suspended in a mixed solvent containing 600 mL of DMSO and 300 mL of methanol, and the suspension was stirred at room temperature for 15 minutes. Thereafter, the suspension was filtered through a 1.0 µm membrane filter, and the filter cake was washed with 200 mL of methanol. The white solid thus obtained was dissolved into 46 g of THF and was reprecipitated from 700 g of methanol. The resultant suspension was filtered through a 1.0 µm membrane filter, and the filter cake was washed with 200 mL of methanol. The white solid thus obtained was dried under reduced pressure (50° C., 4 hours) to give 11.64 g of PMDOS-b-PTMSS. The number average molecular weight Mn measured by GPC relative to polystyrene was Mn=21,200, and Mw/Mn=1.10.

Example 1

(Preparation of Block Copolymer 1)

0.3 g of the block copolymer obtained in Synthetic Example 1, namely, poly(5-ethenyl-1,3-benzodioxole)/poly(4-trimethylsilylstyrene) copolymer was dissolved into 29.7 g of methyl isobutyl ketone to give a 1.0% by mass solution. The solution was then filtered through a polyethylene microfilter having a pore size of 0.02 µm. Thus, a solution of a self-assembly film-forming composition including the block copolymer (block copolymer solution 1) was prepared.

(Preparation of Underlayer Film-Forming Composition 1)

0.45 g of a copolymer resin composed of 2-vinylnaphthalene (25% by mole), 4-tert-butylstyrene (60% by mole) and hydroxyethyl acrylate (15% by mole), 0.14 g of 1,3,4,6-tetrakis(methoxymethyl)glycoluril, and 0.01 g of pyridinium p-toluenesulfonate salt were dissolved into a mixed solvent containing 139.58 of propylene glycol monomethyl ether acetate and 59.82 g of propylene glycol monomethyl ether, to give a 0.30% by mass solution. Thereafter, the solution was filtered through a polyethylene microfilter having a pore size of 0.2 µm. A solution 1 of a composition for forming a film under a self-assembly film was thus prepared.

(Preparation of Upper Layer Film-Forming Composition 1)

0.25 g of a copolymer composed of N-cyclohexylmaleimide (50% by mole), 4-tert-butylstyrene (40% by mole) and tert-butyl methacrylate (10% by mole) were dissolved into 9.75 g of diisoamyl ether, to give a 2.5% by mass solution. Thereafter, the solution was filtered through a polyethylene microfilter having a pore size of 0.2 μm. Thus, a solution 3 of a composition for forming an upper layer film on a self-assembly film was prepared.

(Evaluation of Self-Assembly of Block Copolymer)

The underlayer film-forming composition solution 1 obtained above was applied onto a silicon wafer and was heated on a hot plate at 240° C. for 1 minute to form an underlayer film (layer A) having a film thickness of 8 nm. The self-assembly film-forming composition including the block copolymer 1 was applied thereon with a spin coater and was heated on a hot plate at 100° C. for 1 minute to form a self-assembly film (layer B) having a film thickness of 25 nm. The solution 3 of the composition for forming an upper layer film was applied onto the self-assembly film with a spinner to form an upper layer film having a film thickness of 50 nm. The stack was then heated on a hot plate at 200° C. for 5 minutes to induce the formation of a microphase-separated structure in the block copolymer.

(Observation of Microphase-Separated Structure)

After the formation of a microphase-separated structure had been induced, the silicon wafer was placed into an etching device (Lam 2300 Versys Kiyo 45) manufactured by LAM RESEARCH CORPORATION, and was etched for 25 seconds using $O_2$ gas as the etching gas. The upper layer film was thereby removed, and the regions of the block copolymer derived from the silicon-free monomer were preferentially etched. The shape was observed with an electron microscope (S-4800).

Example 2

(Preparation of Underlayer Film-Forming Composition 2)

0.45 g of a copolymer resin composed of 2-vinylnaphthalene (35% by mole), 4-tert-butylstyrene (50% by mole) and hydroxyethyl acrylate (15% by mole), 0.14 g of 1,3,4,6-tetrakis(methoxymethyl)glycoluril, and 0.01 g of pyridinium p-toluenesulfonate salt were dissolved into a solvent containing 139.58 of propylene glycol monomethyl ether acetate and 59.82 g of propylene glycol monomethyl ether, to give a 0.30% by mass solution. Thereafter, the solution was filtered through a polyethylene microfilter having a pore size of 0.2 μm. A solution 2 of a composition for forming a film under a self-assembly film was thus prepared.

(Preparation of Upper Layer Film-Forming Composition 2)

0.25 g of a copolymer composed of N-cyclohexylmaleimide (50% by mole), 4-tert-butylstyrene (20% by mole) and tert-butyl methacrylate (30% by mole) was dissolved into 9.75 g of diisoamyl ether, to give a 2.5% by mass solution. Thereafter, the solution was filtered through a polyethylene microfilter having a pore size of 0.2 μm. Thus, a solution 4 of a composition for forming an upper layer film on a self-assembly film was prepared.

(Evaluation of Self-Assembly of Block Copolymer) (Observation of Microphase-Separated Structure)

The evaluation of self-assembly of block copolymer and the observation of microphase-separated structure were carried out in the same manner as in Example 1, except that solution 2 was used as the underlayer film composition and upper layer film 4 was used as the upper layer film composition.

Example 3

(Preparation of Underlayer Film-Forming Composition 3)

0.45 g of copolymer resin composed of 2-vinylnaphthalene (35% by mole), 4-tert-butylstyrene (50% by mole) and hydroxypropyl methacrylate (15% by mole), 0.14 g of 1,3,4,6-tetrakis(methoxymethyl)glycoluril, and 0.01 g of pyridinium p-toluenesulfonate salt were dissolved into a mixed solvent containing 139.58 of propylene glycol monomethyl ether acetate and 59.82 g of propylene glycol monomethyl ether, to give a 0.30% by mass solution. Thereafter, the solution was filtered through a polyethylene microfilter having a pore size of 0.2 μm. A solution 5 of a composition for forming a film under a self-assembly film was thus prepared.

(Preparation of Upper Layer Film-Forming Composition 3)

0.25 g of a copolymer composed of N-cyclohexylmaleimide (50% by mole), 4-tert-butylstyrene (25% by mole) and tert-butyl methacrylate (25% by mole) was dissolved into 9.75 g of diisoamyl ether, to give a 2.5% by mass solution. Thereafter, the solution was filtered through a polyethylene microfilter having a pore size of 0.2 μm. Thus, a solution 6 of a composition for forming an upper layer film on a self-assembly film was prepared.

(Evaluation of Self-Assembly of Block Copolymer) (Observation of Microphase-Separated Structure)

The evaluation of self-assembly of block copolymer and the observation of microphase-separated structure were carried out in the same manner as in Example 1, except that solution 5 was used as the underlayer film composition and upper layer film 6 was used as the upper layer film composition.

Comparative Example 1

(Preparation of Block Copolymer)

0.3 g of a block copolymer (PS-b-PMMA) which was composed of styrene and methyl methacrylate and had a number average molecular weight Mn of Mn=66000 and Mw/Mn=1.10 determined by GPC relative to polystyrene was dissolved into 29.7 g of methyl isobutyl ketone, to give a 1.0% by mass solution. The solution was then filtered through a polyethylene microfilter having a pore size of 0.02 μm. A solution of a self-assembly film-forming composition (block copolymer solution 2) was thus prepared.

(Evaluation of Self-Assembly of Block Copolymer)

The underlayer film-forming composition prepared in Example 1 (solution 1) was applied onto a silicon wafer and was heated on a hot plate at 240° C. for 1 minute to form an underlayer film (layer A) having a film thickness of 8 nm. The self-assembly film-forming composition including PS-b-PMMA was applied thereon with a spin coater, and was heated on a hot plate at 100° C. for 1 minute to form a self-assembly film (layer B) having a film thickness of 25 nm. The composition for forming an upper layer film (solution 3) was applied onto the self-assembly film with a spinner to form an upper layer film having a film thickness of 50 nm. The stack was then heated on a hot plate at 200° C. for 5 minutes to induce the formation of a microphase-separated structure in the block copolymer.

(Evaluation of Block Copolymer Orientation)

The orientation of the block copolymers prepared in Examples 1 and 2 and Comparative Example 1 was evaluated. The results are summarized in Table 1.

TABLE 1

| | Underlayer | Upper layer | Block copolymer | Orientation of block copolymer |
|---|---|---|---|---|
| Example 1 | Solution 1 | Solution 3 | Poly(5-ethenyl-1,3-benzodioxole)-b-poly(4-trimethylsilylstyrene) | Vertical lamellar orientation |
| Example 2 | Solution 2 | Solution 4 | | Vertical lamellar orientation |
| Example 3 | Solution 5 | Solution 6 | | Vertical lamellar orientation |
| Comparative Example 1 | Solution 1 | Solution 3 | Poly(styrene)-b-poly(methyl methacrylate) | Horizontal lamellar orientation |

Figure 2:
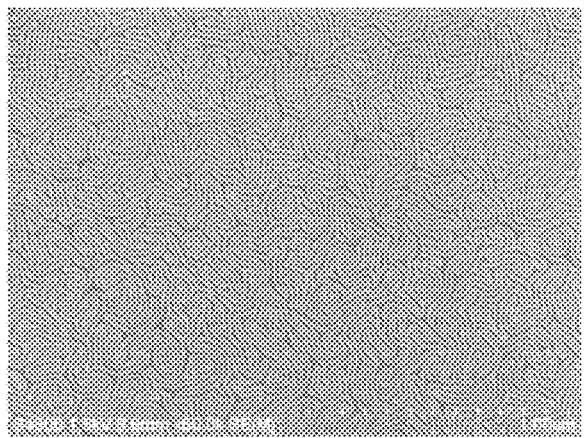
FIG. 2 is a scanning electron micrograph for evaluating the orientation of the block copolymer in Example 1.

As shown in Table 1, the self-assembly film-forming compositions produced using the block copolymer of the present invention successfully formed a microphase-separated structure perpendicularly to the substrate with the application of the underlayer film and the upper layer film, as illustrated in FIG. 2.

INDUSTRIAL APPLICABILITY

The present invention offers great usefulness in industry by making it possible to induce the formation of a microphase-separated structure in a block copolymer layer perpendicularly to a substrate over the entirety of the coating film without the occurrence of misorientation in the microphase-separated structure in the block copolymer.

The invention claimed is:

1. A formulation comprising a block copolymer composition and an underlayer film-forming composition, wherein the formulation is for forming a phase-separated structure in a block copolymer layer formed from the block copolymer composition on an underlayer film formed from the underlayer film-forming composition on a substrate, wherein the underlayer film-forming composition comprises a copolymer comprising the following unit structures:

unit structure (A) derived from a styrene compound containing a tert-butyl group, unit structure (B) derived from an aromatic-containing vinyl compound containing no hydroxy group with the proviso that it is different from unit structure (A), unit structure (C) derived from a compound containing a (meth)acryloyl group and no hydroxy groups, and unit structure (D) derived from a crosslinking group-containing compound, wherein a copolymerization ratio relative to an entirety of the copolymer ranges from 25 to 90% by mole of unit structure (A), from 0 to 65% by mole of unit structure (B), from 0 to 65% by mole of unit structure (C), and from 10 to 20% by mole of unit structure (D), wherein the block copolymer composition comprises a block copolymer and a solvent, wherein the block copolymer comprises a silicon-free polymer and a silicon-containing polymer bonded together, wherein the silicon-containing polymer comprises a unit structure represented by the following formula (2):

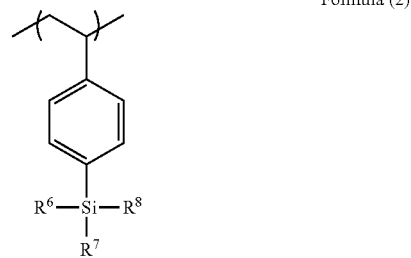

Formula (2)

wherein, in formula (2), $R^6$, $R^7$ and $R^8$ are each independently a C1-C10 alkyl group or a C6-C40 aryl group, and wherein the silicon-free polymer comprises a unit structure represented by formula (1-1) or formula (1-2) below,

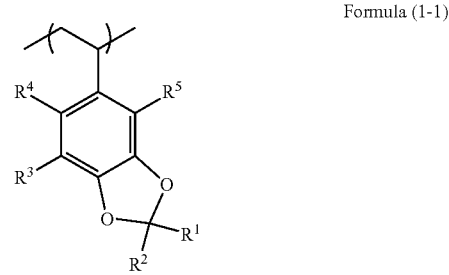

Formula (1-1)

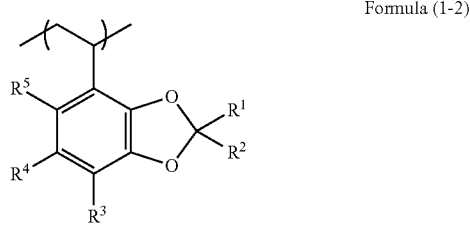

Formula (1-2)

wherein in formula (1-1) and formula (1-2), $R^1$ and $R^2$ are each independently a hydrogen atom, a halogen atom or a C1-C10 alkyl group; and $R^3$ to $R^5$ are each independently a hydrogen atom, a hydroxy group, a halogen atom, a C1-C10 alkyl group, a C1-C10 alkoxy group, a cyano group, an amino group, an amide group or a carbonyl group.

2. The formulation according to claim 1, wherein the formulation further comprises:

an upper layer film-forming composition for forming an upper layer film that overcoats the block copolymer layer, the upper layer film-forming composition comprising a copolymer (A) comprising unit structures (a) derived from a maleimide structure and from a styrene structure.

3. A method for producing a phase-separated pattern by a block copolymer using the formulation according to claim 1, comprising the steps of:
   (1) forming an underlayer film from the underlayer film-forming composition on a substrate,
   (2) forming a block copolymer layer from the block copolymer composition on the underlayer film, and
   (3) separating the block copolymer layer formed on the underlayer film into phases.

4. The method according to claim 3 for producing a phase-separated pattern by a block copolymer, further comprising the step of forming an upper layer film on the block copolymer layer between step (2) and step (3).

5. A process for manufacturing a semiconductor device using the formulation according to claim 1, comprising the steps of:
   (1) forming an underlayer film from the underlayer film-forming composition on a substrate,
   (2) forming a block copolymer layer from the block copolymer composition on the underlayer film,
   (3) separating the block copolymer layer formed on the underlayer film substrate into phases,
   (4) etching the block copolymer layer separated into phases, and
   (5) etching the substrate.

6. A laminate comprising, sequentially on a substrate:
   (1) an underlayer film on the substrate, wherein the underlayer film comprises a copolymer comprising the following unit structures:
      unit structure (A) derived from a styrene compound containing a tert-butyl group,
      unit structure (B) derived from an aromatic-containing vinyl compound containing no hydroxy group with the proviso that it is different from unit structure (A),
      unit structure (C) derived from a compound containing a (meth)acryloyl group and no hydroxy groups, and
      unit structure (D) derived from a crosslinking group-containing compound,
      wherein a copolymerization ratio relative to an entirety of the copolymer ranges from 25 to 90% by mole of unit structure (A), from 0 to 65% by mole of unit structure (B), from 0 to 65% by mole of unit structure (C), and from 10 to 20% by mole of unit structure (D),
   (2) a block copolymer layer comprising a block copolymer comprising a silicon-free polymer and a silicon-containing polymer bonded together,
      wherein the silicon-containing polymer comprises a unit structure represented by the following formula (2):

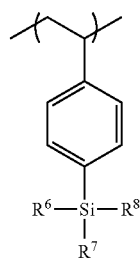

Formula (2)

wherein, in formula (2), $R^6$, $R^7$ and $R^8$ are each independently a C1-C10 alkyl group or a C6-C40 aryl group, wherein the silicon-free polymer comprises a unit structure represented by formula (1-1) or formula (1-2) below,

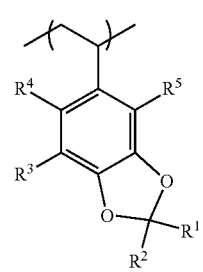

Formula (1-1)

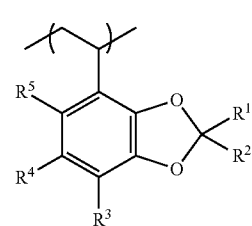

Formula (1-2)

wherein in formula (1-1) and formula (1-2), $R^1$ and $R^2$ are each independently a hydrogen atom, a halogen atom or a C1-C10 alkyl group; and $R^3$ to $R^5$ are each independently a hydrogen atom, a hydroxy group, a halogen atom, a C1-C10 alkyl group, a C1-C10 alkoxy group, a cyano group, an amino group, an amide group or a carbonyl group, and (3) an upper layer film.

* * * * *